(12) United States Patent
Yu et al.

(10) Patent No.: US 10,461,233 B2
(45) Date of Patent: Oct. 29, 2019

(54) LIGHT EMITTING DEVICE PACKAGE AND LIGHTING DEVICE

(71) Applicant: LG INNOTEK CO., LTD., Seoul (KR)

(72) Inventors: Dong Hyun Yu, Seoul (KR); Kyung Ho Kang, Seoul (KR); Nae Sang Yun, Seoul (KR); Meen Soo Choe, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/779,366

(22) PCT Filed: Nov. 28, 2016

(86) PCT No.: PCT/KR2016/013790
§ 371 (c)(1),
(2) Date: May 25, 2018

(87) PCT Pub. No.: WO2017/091051
PCT Pub. Date: Jun. 1, 2017

(65) Prior Publication Data
US 2018/0358523 A1    Dec. 13, 2018

(30) Foreign Application Priority Data

Nov. 27, 2015 (KR) .......................... 10-2015-0167628
Nov. 27, 2015 (KR) .......................... 10-2015-0167653
Nov. 27, 2015 (KR) .......................... 10-2015-0167658

(51) Int. Cl.
*H01L 33/62* (2010.01)
*H01L 33/10* (2010.01)
(Continued)

(52) U.S. Cl.
CPC .............. *H01L 33/62* (2013.01); *H01L 33/10* (2013.01); *H01L 33/486* (2013.01);
(Continued)

(58) Field of Classification Search
CPC ......... H01L 33/62; H01L 33/32; H01L 33/10; H01L 33/48; H01L 2224/48247
See application file for complete search history.

(56) References Cited

U.S. PATENT DOCUMENTS 10,103,303 B2 * 10/2018 Yu ........................... H01L 33/62
2006/0267040 A1 * 11/2006 Baek ..................... H01L 25/167
257/99
(Continued)

FOREIGN PATENT DOCUMENTS

JP    2011-176271 A    9/2011
JP    2014-212347 A    11/2014
(Continued)

OTHER PUBLICATIONS

International Search Report issued in PCT/KR2016/013790 (PCT/ISA/210), dated Mar. 17, 2017.

*Primary Examiner* — Galina G Yushina
(74) *Attorney, Agent, or Firm* — Birch, Stewart, Kolasch & Birch, LLP

(57) ABSTRACT

A light emitting device package of an embodiment including a first lead frame; a light emitting device mounted on the first lead frame; a second lead frame spaced apart from the first lead frame in a first direction; a protective device mounted on the second lead frame; and a body coupled to the first and second lead frames, wherein the first lead frame includes a first stepped portion disposed along an edge of a lower surface thereof, and the second lead frame includes a third stepped portion disposed along an edge of a lower surface thereof, a mounting region of the protective device which is not overlapped in a vertical direction and spaced apart from the third stepped portion, and a second wire recess portion which is partially overlapped with the third stepped portion in the vertical direction.

20 Claims, 10 Drawing Sheets

(51) Int. Cl.
*H01L 33/48* (2010.01)
*H01L 33/32* (2010.01)
*H01L 25/16* (2006.01)
*H01L 33/40* (2010.01)

(52) U.S. Cl.
CPC ............ *H01L 25/167* (2013.01); *H01L 33/32* (2013.01); *H01L 33/405* (2013.01); *H01L 2224/48247* (2013.01); *H01L 2933/0033* (2013.01)

(56) References Cited

U.S. PATENT DOCUMENTS

| | | | |
|---|---|---|---|
| 2007/0064429 A1* | 3/2007 | Mazzochette | G09F 9/33 362/296.02 |
| 2010/0102348 A1* | 4/2010 | Lin | H01L 33/486 257/98 |
| 2010/0123156 A1* | 5/2010 | Seo | H01L 33/54 257/99 |
| 2011/0186902 A1 | 8/2011 | Egoshi et al. | |
| 2013/0121000 A1 | 5/2013 | Lee et al. | |

FOREIGN PATENT DOCUMENTS

| | | |
|---|---|---|
| KR | 10-0888236 B1 | 3/2009 |
| KR | 10-2010-0129928 A | 12/2010 |
| KR | 10-2013-0054040 A | 5/2013 |
| KR | 10-2013-0096095 A | 8/2013 |

* cited by examiner

[FIG. 1]
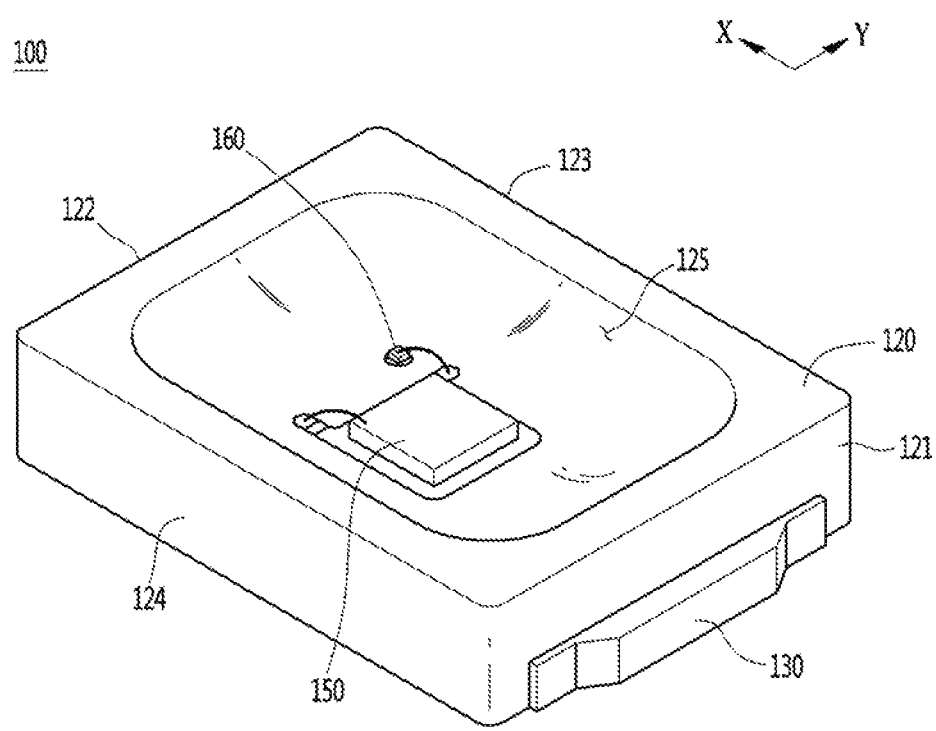

[FIG. 2]
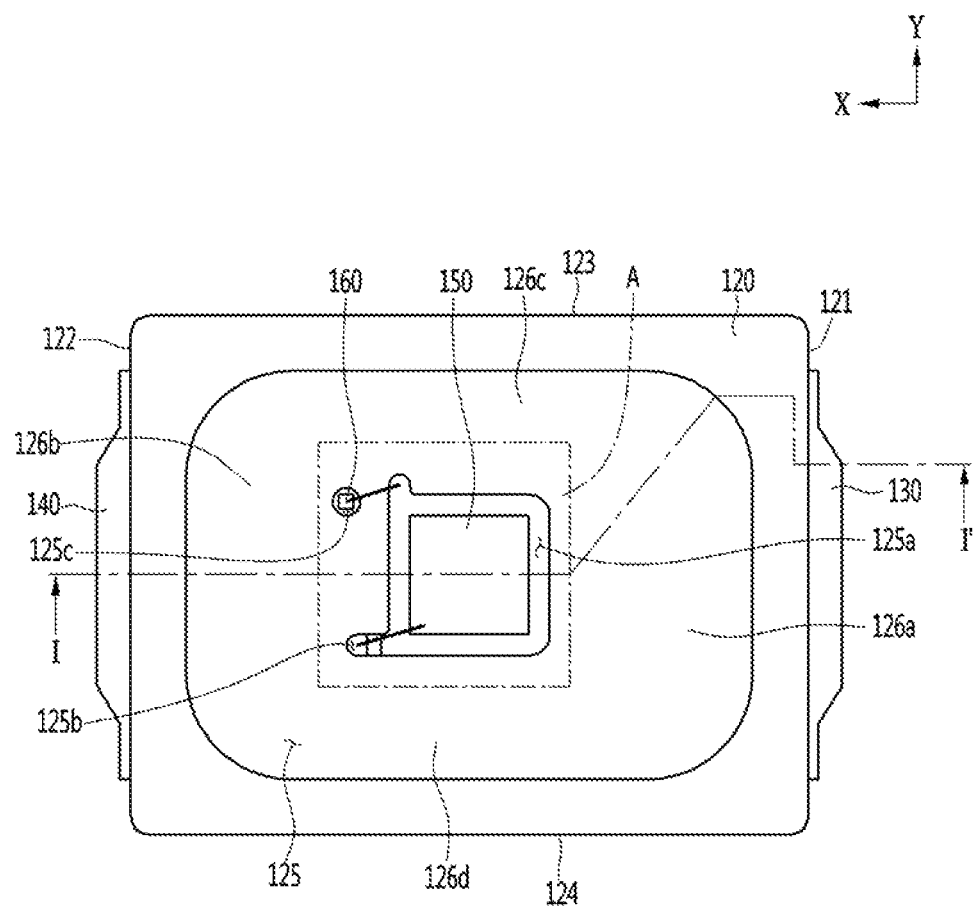

[FIG. 3]
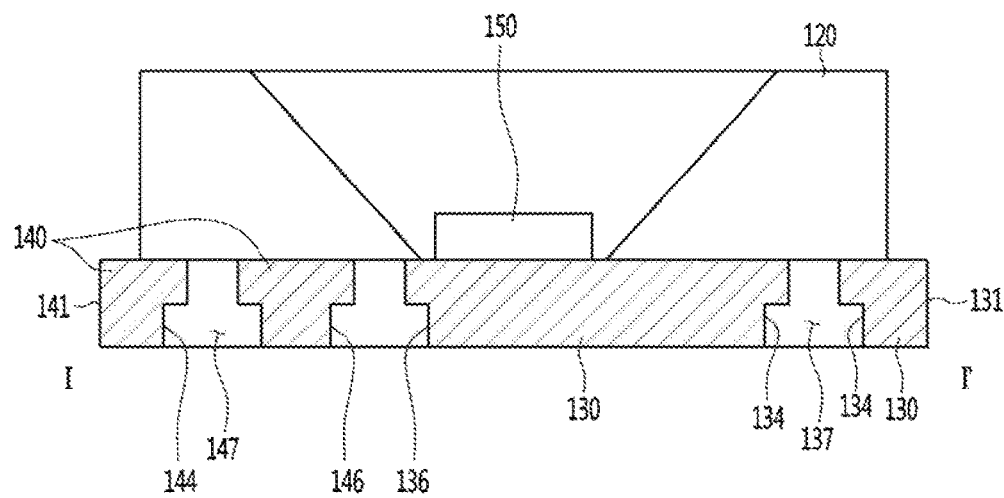
[FIG. 4]
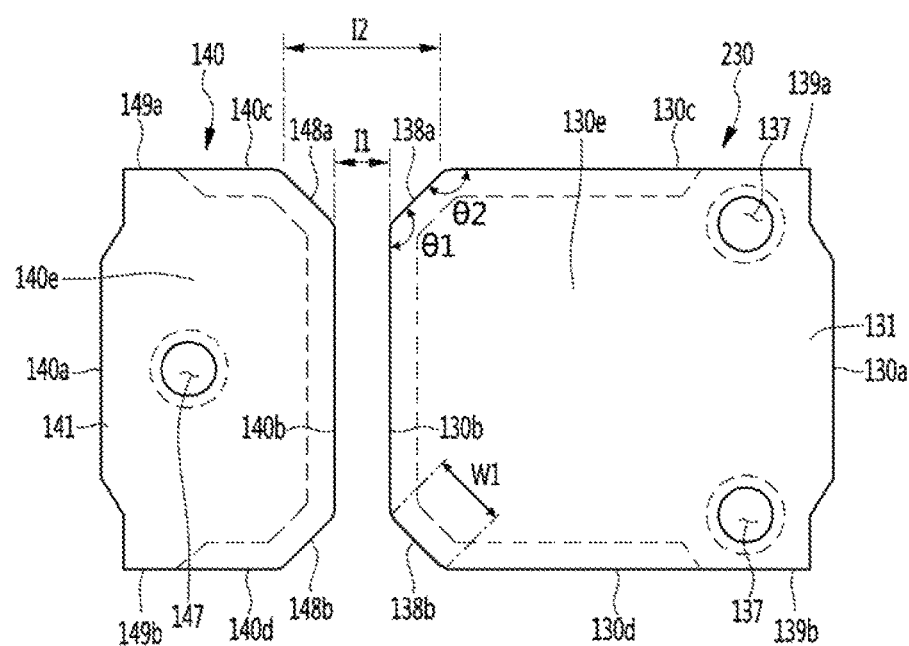

【FIG. 5】
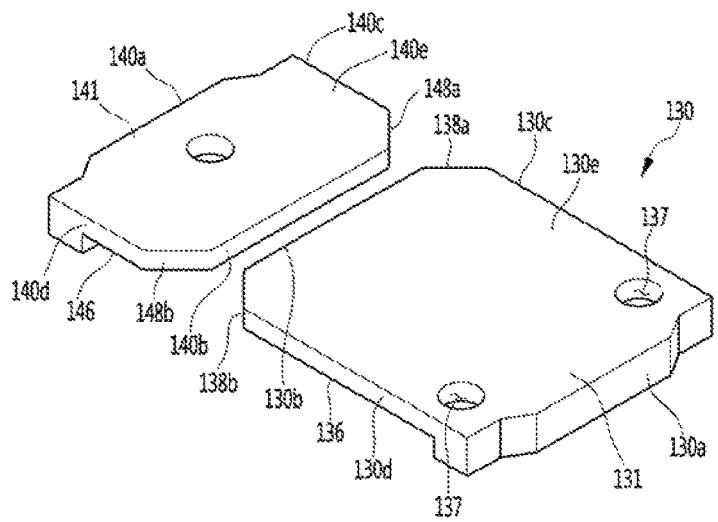
【FIG. 6】
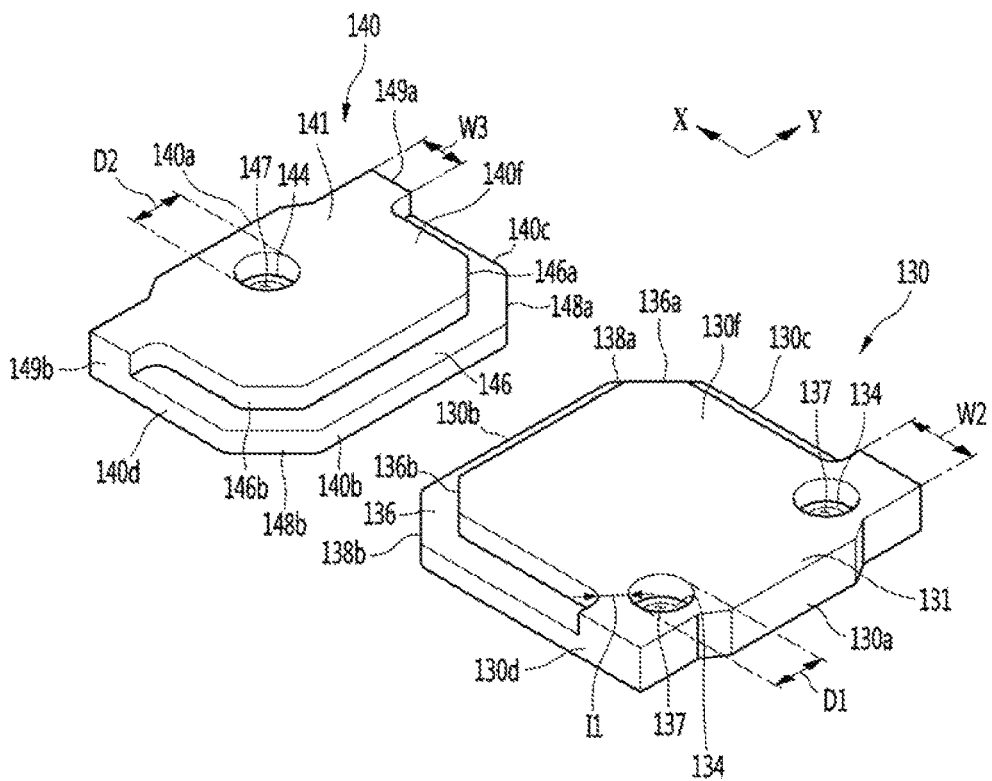

【FIG. 7】
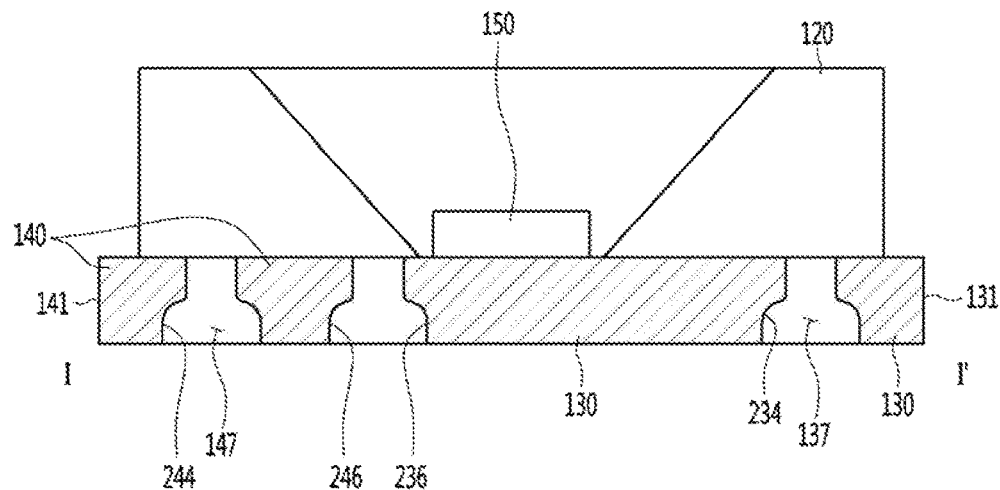
【FIG. 8】
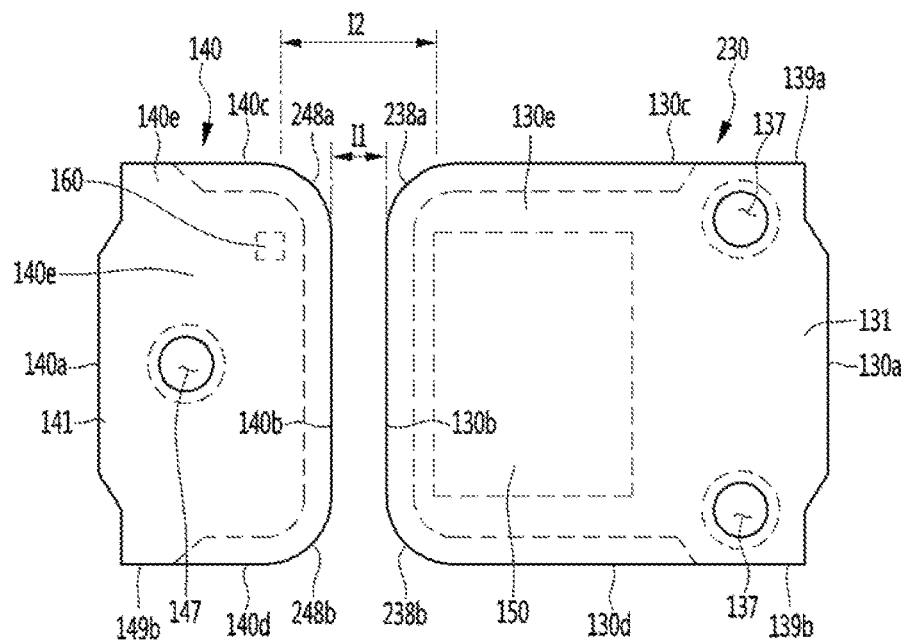

[FIG. 9]
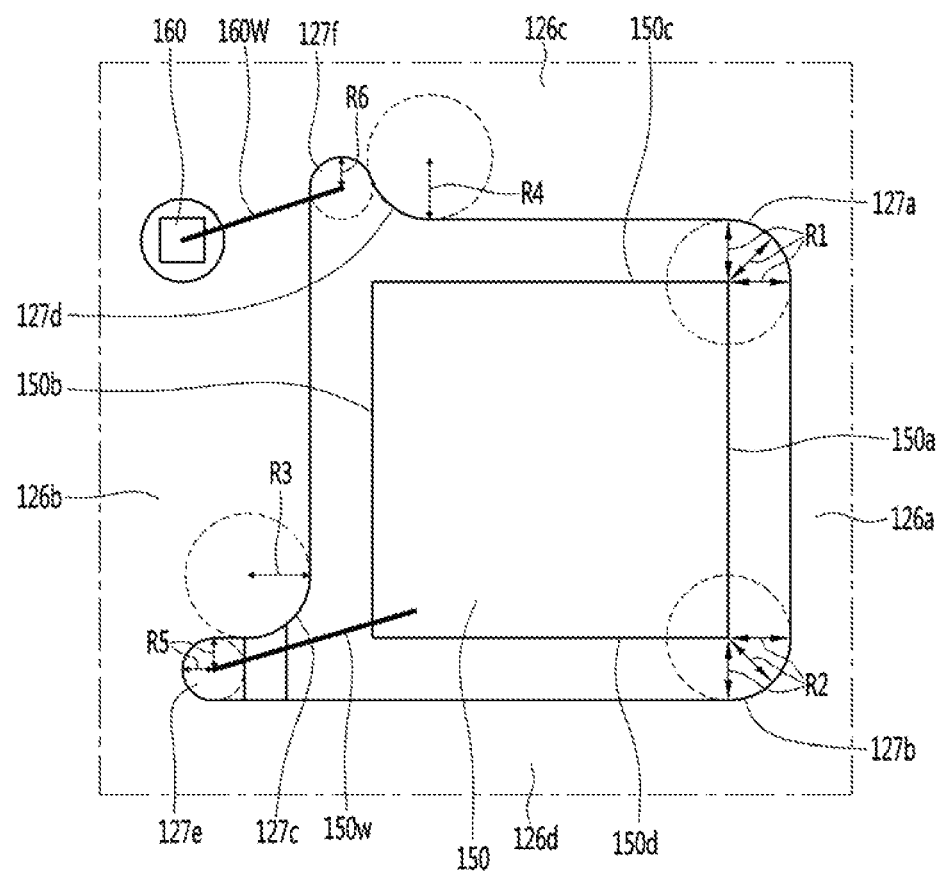

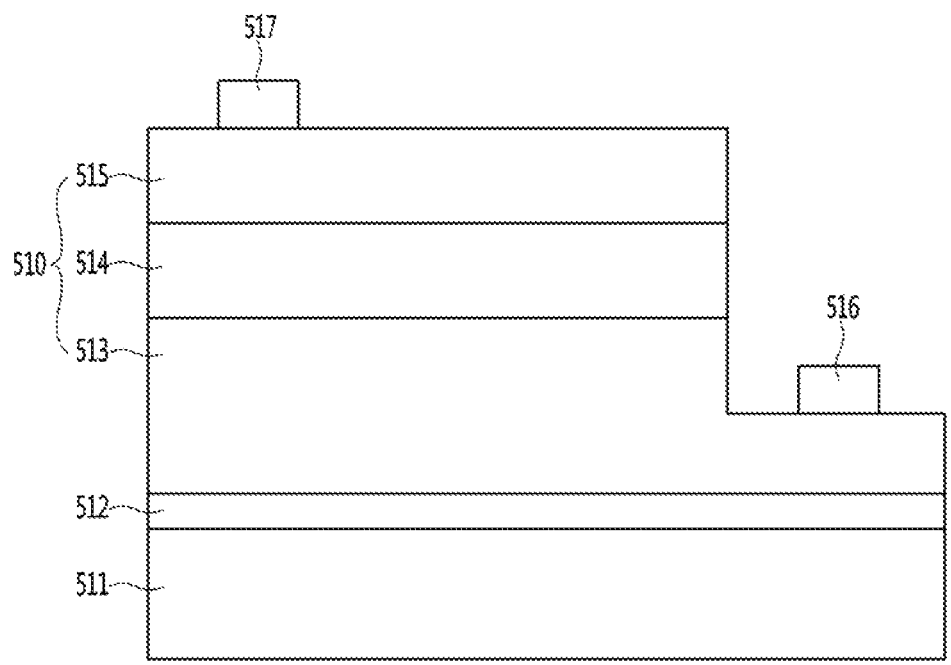
[FIG. 10]

[FIG. 11]
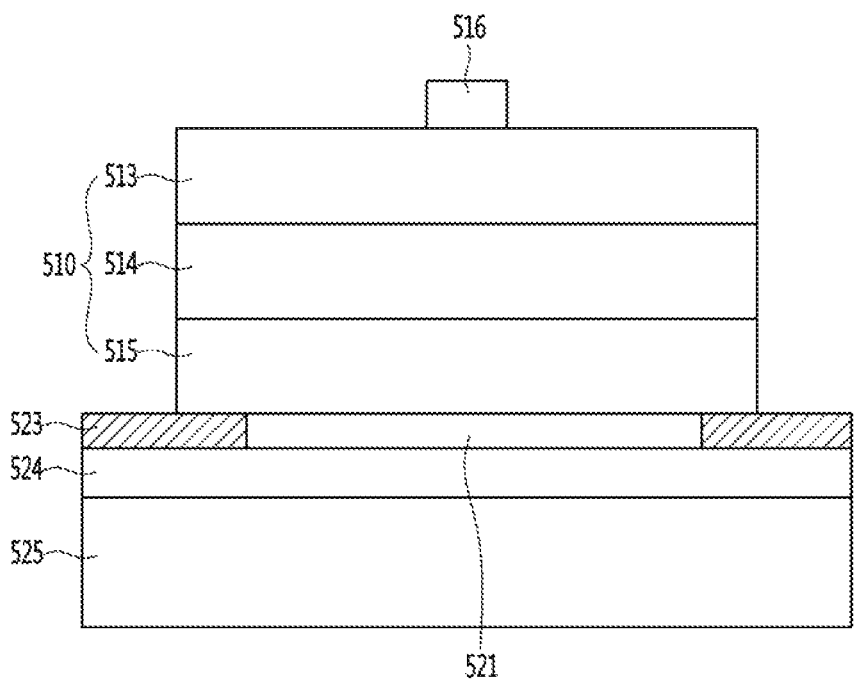

[FIG. 12]
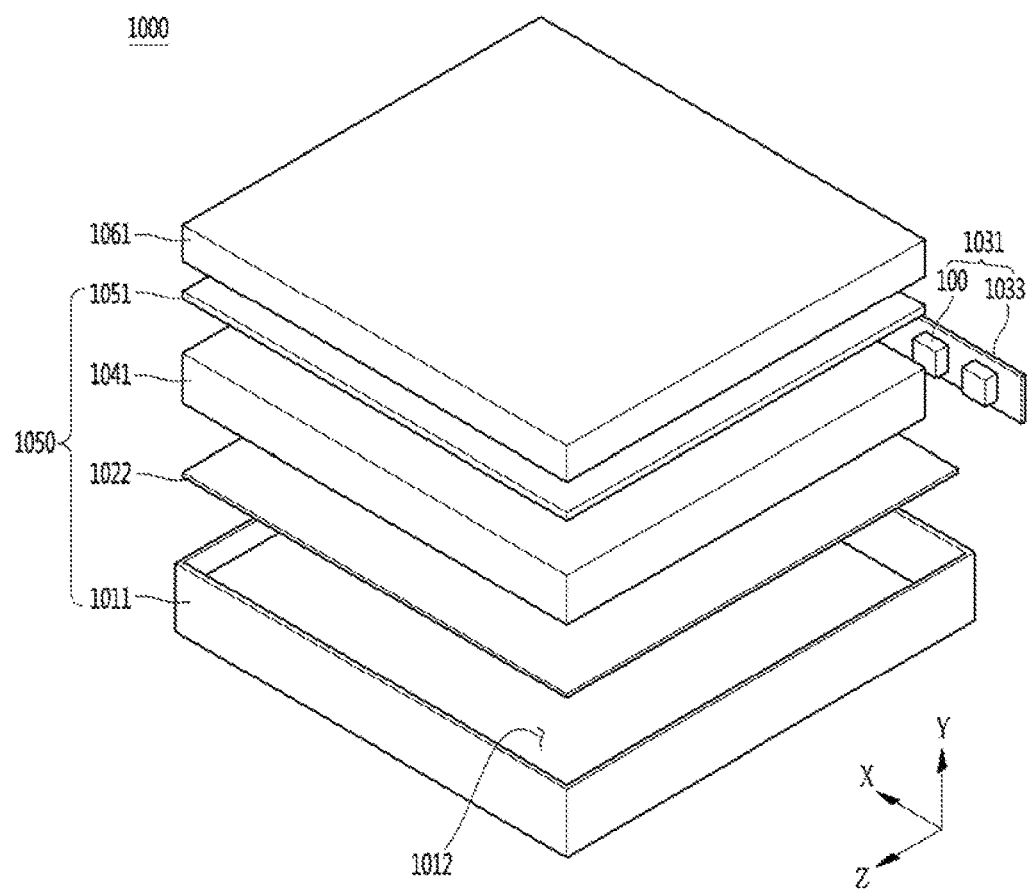

[FIG. 13]
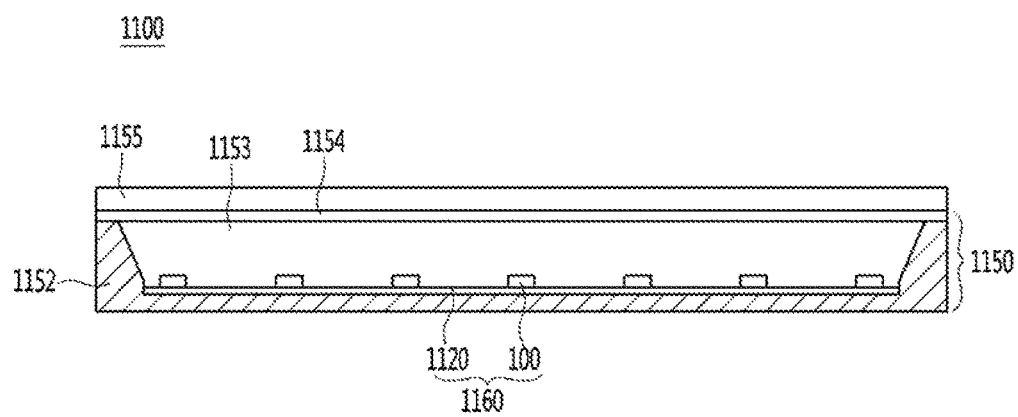

LIGHT EMITTING DEVICE PACKAGE AND LIGHTING DEVICE

CROSS REFERENCE TO RELATED APPLICATIONS

This application is the National Phase of PCT International Application No. PCT/KR2016/013790, filed on Nov. 28, 2016, which claims priority under 35 U.S.C. 119(a) to Patent Application Nos. 10-2015-0167628, filed in the Republic of Korea on Nov. 27, 2015, 10-2015-0167653, filed in the Republic of Korea on Nov. 27, 2015, and 10-2015-0167658, filed in the Republic of Korea on Nov. 27, 2015, all of which are hereby expressly incorporated by reference into the present application.

TECHNICAL FIELD

Embodiments relate to a light emitting device package and a lighting device.

BACKGROUND ART

A light emitting device is a kind of semiconductor devices that convert electrical energy into light, and is in the spotlight as a next generation light source replacing a conventional fluorescent lamp, an incandescent lamp, etc.

Since a light emitting diode generates light by using the semiconductor devices, the light emitting diode consumes very low power as compared with incandescent lamps which generate light by heating tungsten, or fluorescent lamps which generate light by colliding ultraviolet rays generated through high pressure discharge on a phosphor.

In addition, since the light emitting diode generates light using potential gaps of the semiconductor devices, the light emitting diode has long life span, fast response characteristics, and eco-friendly characteristics compared to conventional light sources.

Accordingly, various studies have been performed to replace the conventional light sources with the light emitting diode, and the light emitting diode is increasingly used as light sources for lighting devices used indoors and outdoors such as various lamps, liquid crystal display devices, electronic signboards, street lamps, etc.

DISCLOSURE

Technical Problem

An embodiment provides a light emitting device package and a lighting device having a structure capable of improving injection molding in a spaced space between a first lead frame and a second lead frame.

An embodiment provides a light emitting device package and a lighting device capable of improving a stiffness at exposed edges of first and second lead frames.

An embodiment provides a light emitting device package and a lighting device capable of improving coupling force between first and second lead frames and a body.

An embodiment provides a light emitting device package and a lighting device capable of improving reliability of injection molding of a body.

An embodiment provides a light emitting device package and a lighting device capable of improving light extraction efficiency.

Technical Solution

A light emitting device package of an embodiment includes: a first lead frame; a light emitting device mounted on the first lead frame; a second lead frame spaced apart from the first lead frame in a first direction; a protective device mounted on the second lead frame; and a body coupled to the first and second lead frames, wherein the first lead frame includes a first stepped portion disposed along an edge of lower surface thereof, and the second lead frame includes a third stepped portion disposed along an edge of a lower surface thereof, a mounting region of the protective device which is not overlapped in a vertical direction and spaced apart from the third stepped portion, and a second wire recess portion which is partially overlapped with the third stepped portion in the vertical direction, wherein the first and third stepped portions improve injection molding into a space between the first lead frame and second lead frame.

That is, in an embodiment, edge portions or curved surface portions may be disposed around a spaced space of the first and second lead frames to improve injection molding defects, thereby improving productivity.

A lighting device of an embodiment may include the light emitting device package.

Advantageous Effects

In the light emitting device package of an embodiment, by proposing a structure in which an interval around the side portions is wider by edge portions disposed around the side portions rather than a spaced interval between side portions facing first and second lead frames, injection molding can be improved in a spaced space between the first lead frame and second lead frame.

That is, in an embodiment, edge portions or curved surface portions may be disposed around a spaced space of the first and second lead frames to improve injection molding defects, thereby improving productivity.

The light emitting device package of an embodiment may include edge portions having the same thickness as those of the first and fifth side portions around the exposed first and fifth side portions of the first and second lead frames to improve stiffness of the first and second lead frames. That is, in an embodiment, stiffness of the first and second lead frames may be improved by a structure of stepped portions and edge portions disposed at edges of lower surfaces of the first and second lead frames, and simultaneously, a coupling force with a body may be improved.

In an embodiment, edge portions may be disposed around the side portions facing the first and second lead frames, and thus injection molding can be improved in a spaced space between the first lead frame and second lead frame. That is, the embodiment improves the injection molding defects around the spaced apart spaces of the first and second lead frames, so that the productivity can be improved.

The light emitting device package of an embodiment may include a predetermined curvature at corners of inner side surfaces of a cavity configured to expose the first and second lead frames to improve defects such as cracks which may occur at corner regions of the cavity. That is, in an embodiment, reliability of the injection molding for coupling the body and the first and second lead frames may be improved.

In addition, in an embodiment, an interval between the inner side surfaces of the cavity and the light emitting device is uniformly maintained as a whole, thereby improving light loss at corner regions of the cavity. That is, in an embodiment, light extraction efficiency may be improved.

DESCRIPTION OF DRAWINGS

FIG. 1 is a perspective view illustrating a light emitting device package according to one embodiment.

FIG. 2 is a plan view illustrating a light emitting device package according to one embodiment.

FIG. 3 is a cross-sectional view illustrating a light emitting device package according to one embodiment.

FIG. 4 is a plan view illustrating first and second lead frames according to one embodiment.

FIG. 5 is a perspective view illustrating an upper portion of first and second lead frames according to one embodiment.

FIG. 6 is a perspective view illustrating a lower portion of first and second lead frames according to one embodiment.

FIG. 7 is a cross-sectional view illustrating a light emitting device package according to another embodiment.

FIG. 8 is a plan view illustrating first and second lead frames according to another embodiment.

FIG. 9 is a view illustrating a region A of FIG. 2 according to still another embodiment.

FIG. 10 is a cross-sectional view illustrating a light emitting chip included in a light emitting device package of an embodiment.

FIG. 11 is a cross-sectional view illustrating a light emitting chip of another example included in a light emitting device package of an embodiment.

FIG. 12 is a perspective view illustrating a display device including a light emitting device package of an embodiment.

FIG. 13 is a cross-sectional view illustrating another example of a display device including a light emitting device package of an embodiment.

MODES OF THE INVENTION

The present embodiments may be modified into another form or may be combined with some embodiments, and the scope of the present invention is not limited to each embodiment described below.

Although the matters described in a specific embodiment are not described in other embodiments, unless otherwise stated or contradictory to the description, other embodiments may be understood in connection with the description.

For example, if features for configuration A are described in a particular embodiment and features for configuration B are described in another embodiment, although embodiments in which the configurations A and B are combined are not explicitly described, unless otherwise stated or contradictory, it should be understood that the combination belongs to the scope of rights of the present invention.

Hereinafter, embodiments of the present invention capable of realizing the above objects will be described with reference to the accompanying drawings.

In the description of embodiments, it should be understood that when a device is referred to as being "on or under" another device, the term on or under refers to either a direct connection between two devices or an indirect connection between two devices having one or more devices formed therebetween. In addition, when the term "on or under" is used, it may refer to a downward direction as well as an upward direction with respect to a device.

A semiconductor device may include various electronic devices such as a light emitting device and a light-receiving device, and both of the light emitting device and the light-receiving device may include a first conductive semiconductor layer, an active layer, and a second conductive semiconductor layer.

The semiconductor device according to the present embodiment may be a light emitting device.

The light emitting device emits light by recombination of electrons and holes, and the wavelength of this light is determined by an intrinsic energy band gap of a material.

Accordingly, emitted light may be different depending on a composition of the material.

FIG. 1 is a perspective view illustrating a light emitting device package according to one embodiment, FIG. 2 is a plan view illustrating a light emitting device package according to one embodiment, FIG. 3 is a cross-sectional view illustrating a light emitting device package according to one embodiment, FIG. 4 is a plan view illustrating first and second lead frames according to one embodiment, FIG. 5 is a perspective view illustrating an upper portion of first and second lead frames according to one embodiment, and FIG. 6 is a perspective view illustrating a lower portion of first and second lead frames according to one embodiment.

As shown in FIGS. 1 to 6, a light emitting device package 100 according to one embodiment may include a first lead frame 130, a second lead frame 140, a body 120, a protective device 160, and a light emitting device 150.

The light emitting device 150 may be disposed on the first lead frame 130. The light emitting device 150 may be disposed on an upper surface of the first lead frame 130 exposed from the body 120. The light emitting device 150 of an embodiment is described as being limited to a single configuration, but is not limited thereto, and may be configured as a plurality of two or more, and may be configured in a form of an array. The light emitting device 150 may be connected through a wire, but is not limited thereto. The light emitting device 150 may be disposed at a center of the body 120, but is not limited thereto.

The protective device 160 may be disposed on the second lead frame 140. The protective device 160 may be disposed on an upper surface of the second lead frame 140 exposed from the body 120. The protective device 160 may be a Zener diode, a thyristor, a transient voltage suppression (TVS), or the like, but is not limited thereto. The protective device 160 of an embodiment will be described as an example of a Zener diode protecting the light emitting device 150 from electro static discharge (ESD). The protective device 160 may be connected to the first lead frame 130 through a wire.

The body 120 may include at least one of a light-transmitting material, a reflective material, and an insulating material. The body 120 may include a material having higher reflectance than transmittance for light emitted from the light emitting device 150. The body 120 may be a resin-based insulating material. For example, the body 120 may be formed of at least one of a resin material such as polyphthalamide (PPA), epoxy or silicone material, silicon (Si), a metal material, photo sensitive glass (PSG), sapphire ($Al_2O_3$), and a printed circuit board (PCB). The body 120 may include an outer side surface having a predetermined curvature or an outer side surface having an angular surface. The body 120, for example, may have a top view in a circular or polygonal shape. The body 120 of an embodiment will be described as an example of taking a polygonal shape including first to fourth outer side surfaces 121 to 124.

The body 120 may be coupled to the first and second lead frames 130 and 140. The body 120 may include a cavity 125 configured to expose a part of upper surfaces of the first and second lead frames 130 and 140.

The cavity 125 may include a first bottom surface 125a configured to expose the first lead frame 130 and second and third bottom surfaces 125b and 125c configured to expose the second lead frame 140. The first bottom surface 125a may correspond to a shape of the light emitting device 150 as a region in which the light emitting device 150 is mounted. The first bottom surface 125a may further include a region in which a wire of the protective device 160 is connected. An edge of the first bottom surface 125a may have a predetermined curvature. The edge of the first bottom surface 125a having a curvature may improve light efficiency by maintaining a predetermined interval of an inner side surface of the cavity 125 from the light emitting device 150. The second bottom surface 125b may be disposed in a region adjacent to the first lead frame 130 as a region in which a wire of the light emitting device 150 is connected to the second lead frame 140. The third bottom surface 125c may be spaced at a predetermined interval apart from the second bottom surface 125b as a region in which the protective device 160 is mounted, but is not limited thereto.

The body 120 may include first to fourth outer side surfaces 121 to 124, and may have a top view in a rectangular shape. The first and second outer side surfaces 121 and 122 may be disposed in parallel in a first direction X. In an embodiment, a part of the first and second lead frames 130 and 140 may be exposed from the first and second outer side surfaces 121 and 122. In an embodiment, a first side portion 130a of the first lead frame 130 may be exposed from the first outer side surface 121. In an embodiment, a fifth side portion 140a of the second lead frame 140 may be exposed from the second outer side surface 122. The third and fourth outer side surfaces 123 and 124 may be disposed in parallel in a second direction Y orthogonal to the first direction X. In an embodiment, the first and second lead frames 130 and 140 are not exposed from the third and fourth outer side surfaces 123 and 124. That is, the first and second lead frames 130 and 140 of an embodiment may be disposed at inner sides of the third and fourth outer side surfaces 123 and 124.

The first and second lead frames 130 and 140 may be spaced at a predetermined interval apart from each other and coupled to the body 120. The light emitting device 150 may be mounted on the first lead frame 130, and the protective device 160 may be mounted on the second lead frame 140. The first and second lead frames 130 and 140 may be disposed in parallel in the first direction X. The first lead frame 130 may have a width in the first direction X larger than that of the second lead frame 140, but is not limited thereto. The first and second lead frames 130 and 140 may include a conductive material. For example, the first and second lead frames 130 and 140 may be formed of at least one of titanium (Ti), copper (Cu), nickel (Ni), gold (Au), chromium (Cr), tantalum (Ta), platinum (Pt), tin (Sn), silver (Ag), phosphorus (P), iron (Fe), zinc (Zn), and aluminum (Al), and may be formed in a plurality of layers. For example, the first and second lead frames 130 and 140 of an embodiment may be composed of a base layer containing copper (Cu) and an oxidation preventing layer containing silver (Ag) to cover the base layer, but is not limited thereto.

The first lead frame 130 may include first to fourth side portions 130a to 130d, an upper surface 130e on which the light emitting device 150 is mounted, and a lower surface 130f exposed on a bottom surface of the body 120. The first lead frame 130 may include a first through hole 137 penetrating from the upper surface 130e to the lower surface 130f and a first stepped portion 136 disposed at an edge of the lower surface 130f. The first to fourth side portions 130a to 130d may correspond to an entire outer side surfaces of the first lead frame 130. The second to fourth side portions 130b to 130d may be in contact with the first stepped portion 136. For example, the first stepped portion 136 may be disposed at an inner side of the first lead frame 130 from the second to fourth side portions 130b to 130d.

The first side portion 130a may correspond to the first side surface 121 of the body 120. The first side portion 130a may be exposed from the first side surface 121 of the body 120 to outside. The first side portion 130a may protrude in an outward direction from the first side surface 121 of the body 120. The first side portion 130a may be exposed from the first side surface 121 of the body 120 to outside. The first side portion 130a may include a first protrusion part 131 protruding outward. The first protrusion part 131 may be disposed in a central region of the first side portion 130a. A stepped structure may be included at both end portions of the first protrusion part 131. The stepped structure may be arranged in parallel in the second direction Y of the first protrusion part 131 and may extend from the first protrusion part 131. Although not shown in detail in the drawing, a surface of the first protrusion part 131 may be an oxidation preventing layer containing silver (Ag).

The second side portion 130b may be disposed adjacent to the second lead frame 140. The second side portion 130b may face a sixth side portion 140b of the second lead frame 140. The second side portion 130b is not exposed to the outside by the body 120. The first lead frame 130 may include first and second edge portions 138a and 138b that are symmetrical in the second direction Y at both end portions of the second side portion 130b. The first and second edge portions 138a and 138b may improve reliability of forming the body 120 in the process of coupling the body 120 and the first and second lead frames 130 and 140. For example, the body 120, the first and second lead frames 130 and 140 may be coupled by an injection process. The first and second edge portions 138a and 138b may improve an injection flow into a spaced space of the first and second lead frames 130 and 140 in the injection process of the body 120. A first inclination angle θ1 formed between the first edge portion 138a and the second side portion 130b may be an obtuse angle. In addition, a second inclination angle θ2 between the first edge portion 138a and the third side portion 130c may be an obtuse angle. The first and second inclination angles θ1 and θ2 may be equal to or different from each other. For example, the first and second inclination angles θ1 and θ2 may be 135 degrees or more. When the first and second inclination angles θ1 and θ2 are less than 135 degrees, it is possible to cause injection defects into the spaced space of the first and second lead frames 130 and 140. The first and second edge portions 138a and 138b may be closer to the first side portion 130a as they become father from the second side portion 130b. A first width W1 of the first and second edge portions 138a and 138b may be 50 μm or more. For example, the first width W1 of the first and second edge portions 138a and 138b may be 50 to 500 μm. When the first width W1 of the first and second edge portions 138a and 138b is less than 50 μm, a manufacturing is difficult. When an overall size of the light emitting device package 100 is considered, although the first width W1 of the first and second edge portions 138a and 138b may not exceed 500 μm, an upper limit of the first width W1 of the first and second edge portions 138a and 138b may be changed depending on a change of the overall size of the light emitting device package 100. An inclination angle of the second edge portion 138b may employ a feature of the first edge portion 138a.

The third and fourth side portions 130c and 130d may be symmetrical to each other, and may be a flat surface. The third and fourth side portions 130c and 130d are not exposed to the outside by the body 120. The third and fourth side portions 130c and 130d may be disposed in the body 120.

The third side portion 130c may be disposed between the first edge portion 138a and the first side portion 130a. The third side portion 130c may extend from the first edge portion 138a. The third side portion 130c may include a seventh edge portion 139a. The seventh edge portion 139a may extend from the first side portion 130a. The seventh edge portion 139a may have the same thickness as that of the first side portion 130a. The seventh edge portion 139a may be orthogonal to the first side portion 130a. An angle between the seventh edge portion 139a and the first side portion 130a may be a right angle.

The fourth side portion 130d may be disposed between the second edge portion 138b and the first side portion 130a. The fourth side portion 130d may extend from the second edge portion 138b. The fourth side portion 130d may include an eighth edge portion 139b. The second edge portion 138b may extend from the first side portion 130a. The eighth edge portion 139b may have the same thickness as that of the first side portion 130a. The eighth edge portion 139b may be orthogonal to the first side portion 130a. An angle between the eighth edge portion 139b and the first side portion 130a may be a right angle.

The seventh and eighth edge portions 139a and 139b may include the same second width W2 in the first direction X, but are not limited thereto. The second width W2 may be 200 μm or more. For example, the second width W2 may be 200 to 500 μm. When the second width W2 is less than 200 μm, a space configured to form the first through hole 137 may be insufficient. When the first through hole 137 is omitted, a coupling force between the first lead frame 130 and the body 120 may be reduced. In addition, when the second width W2 is less than 200 μm, a strength of the first lead frame 130 may be reduced in a cutting process and the first lead frame 130 may be separated from the body 120 due to warping or the like.

The first stepped portion 136 may be disposed at an edge of the lower surface 130f of the first lead frame 130. For example, the first stepped portion 136 of an embodiment may be disposed under the second to fourth side portions 130b to 130d. The first stepped portion 136 may be spaced apart from the first side portion 130a. The first stepped portion 136 may be spaced apart from the seventh and eighth edge portions 139a and 139b in the first direction X. The first stepped portion 136 extends from the seventh and eighth edge portions 139a and 139b but is not overlapped with each other. The first stepped portion 136 may include third and fourth edge portions 136a and 136b in regions corresponding to the first and second edge portions 138a and 138b. The third and fourth edge portions 136a and 136b may be spaced apart from and parallel to the first and second edge portions 138a and 138b at a predetermined interval. Since the first side portion 130a is exposed to the outside and an external force is concentrated by the cutting process, for stiffness, the first side portion 130a may be spaced apart from the first stepped portion 136. The first stepped portion 136 may be a recessed shape and a cross-section thereof may be a stepped structure, but is not limited thereto. The first stepped portion 136 may enlarge a contact area with the body 120 to improve a coupling force with the body 120. In addition, the first stepped portion 136 may improve moisture penetration from the outside by the stepped structure. The first stepped portion 136 may be formed by etching a part of an edge of a lower surface of the first lead frame 130, but is not limited thereto. A thickness of the first stepped portion 136 may be 50% of that of the first lead frame 130, but is not limited thereto. For example, the thickness of the first stepped portion 136 may be 50% or more of that of the first lead frame 130.

The first through hole 137 may penetrate from the upper surface 130e of the first lead frame 130 to the lower surface. The first through hole 137 may be disposed adjacent to the first side portion 130a. The first through hole 137 may be disposed adjacent to the seventh edge portion 139a. The first through hole 137 may be disposed at a corner of the first lead frame 130 adjacent to the first side portion 130a, but is not limited thereto. The first through hole 137 may include a second stepped portion 134. The second stepped portion 134 may have a thickness corresponding to the first stepped portion 136. A first diameter D1 of the first through hole 137 may be 50 μm or more. For example, the first diameter D1 of the first through hole 137 may be 50 to 500 μm. When the first diameter D1 of the first through hole 137 is less than 50 μm, it is not only difficult to manufacture, but also a coupling with the body 120 may be deteriorated.

The second lead frame 140 may include fifth to eighth side portions 140a to 140d, an upper surface 140e on which the protective device 160 is mounted, and a lower surface 140f exposed on the bottom surface of the body 120. The fifth to eighth side portions 140a to 140d may be outer side surfaces of the second lead frame 140. The second lead frame 140 may include a second through hole 147 penetrating from the upper surface 140e to the lower surface 140f and a third stepped portion 146 disposed at an edge of the lower surface 140f.

The fifth side portion 140a may correspond to the second side surface 122 of the body 120. The fifth side portion 140a may be exposed from the second side surface 122 of the body 120 to outside. The fifth side portion 140a may protrude in an outward direction from the second side surface 122 of the body 120. The fifth side portion 140a may be exposed from the second side surface 122 of the body 120 to outside. The fifth side portion 140a may include a second protrusion part 141 protruding outward. The second protrusion part 141 may be disposed in a central region of the fifth side portion 140a. A stepped structure may be included at both end portions of the second protrusion part 141. The stepped structure may be arranged in parallel in the second direction Y of the second protrusion part 141 and may extend from the second protrusion part 141. Although not shown in detail in the drawing, a surface of the second protrusion part 141 may be an oxidation preventing layer containing silver (Ag).

The sixth side portion 140b may be disposed adjacent to the first lead frame 130. The sixth side portion 140b may face the second side portion 130b of the first lead frame 130. The sixth side portion 140b is not exposed to the outside by the body 120. The second lead frame 140 may include fifth and sixth edge portions 148a and 148b that are symmetrical in the second direction Y at both end portions of the sixth side portion 140b. The fifth and sixth edge portions 148a and 148b may improve reliability of forming the body 120 in the process of coupling the body 120 and the first and second lead frames 130 and 140. For example, the body 120, the first and second lead frames 130 and 140 may be coupled by an injection process. The fifth and sixth edge portions 148a and 148b may improve the injection flow into the spaced space of the first and second lead frames 130 and 140 in the injection process of the body 120. A third inclination angle formed between the fifth edge portion 148a and the sixth side portion 140b may be an obtuse angle. In addition, a fourth inclination angle formed between the fifth edge portion 148a and the seventh side portion 140c may be an obtuse angle. The third and fourth inclination angles may be equal to or different from each other. For example, the third and fourth inclination angles may be 135 degrees or more. When the third and fourth inclination angles are less than 135 degrees, it is possible to cause injection defects into the spaced space of the first and second lead frames 130 and 140. The fifth and sixth edge portions 148a and 148b may be closer to the fifth side portion 140a as they become father from the sixth side portion 140b. A width of the fifth and sixth edge portions 148a and 148b may be 50 μm or more. For example, the width of the fifth and sixth edge portions 148a and 148b may be 50 to 500 μm. When the width of the fifth and sixth edge portions 148a and 148b is less than 50 μm, a manufacturing is difficult. When an overall size of the light emitting device package 100 is considered, although the width of the fifth and sixth edge portions 148a and 148b may not exceed 500 μm, an upper limit of the width of the fifth and sixth edge portions 148a and 148b may be changed depending on a change of the overall size of the light emitting device package 100. An inclination angle of the sixth edge portion 148b may employ a feature of the fifth edge portion 148a. The fifth edge portion 148a may be opposite to the first edge portion 138a. The fifth edge portion 148a may face the first edge portion 138a. The sixth edge portion 148b may be opposite to the second edge portion 138b. The sixth edge portion 148b may face the second edge portion 138b.

The seventh and eighth side portions 140c and 140d may be symmetrical to each other, and may be a flat surface. The seventh and eighth side portions 140c and 140d are not exposed to the outside by the body 120. The seventh and eighth side portions 140c and 140d may be disposed in the body 120.

The seventh side portion 140c may be disposed between the fifth edge portion 148a and the fifth side portion 140a. The seventh side portion 140c may extend from the fifth edge portion 148a. The seventh side portion 140c may include a ninth edge portion 149a. The ninth edge portion 149a may extend from the fifth side portion 140a. The ninth edge portion 149a may have the same thickness as that of the fifth side portion 140a. The ninth edge portion 149a may be orthogonal to the fifth side portion 140a. An angle between the ninth edge portion 149a and the fifth side portion 140a may be a right angle.

The eighth side portion 140d may be disposed between the sixth edge portion 148b and the fifth side portion 140a. The eighth side portion 140d may extend from the sixth edge portion 148b. The eighth side portion 140d may include an tenth edge portion 149b. The tenth edge portion 149b may extend from the fifth side portion 140a. The tenth edge portion 149b may have the same thickness as that of the fifth side portion 140a. The tenth edge portion 149b may be orthogonal to the fifth side portion 140a. An angle between the tenth edge portion 149b and the fifth side portion 140a may be a right angle.

The ninth and tenth edge portions 149a and 149b may include the same third width W3 in the first direction X, but are not limited thereto. The third width W3 may be 200 μm or more. For example, the third width W3 may be 200 to 500 μm. When the third width W3 is less than 200 μm, a space configured to form the second through hole 147 may be insufficient.

When the second through hole 147 is omitted, a coupling force between the second lead frame 140 and the body 120 may be reduced. In addition, when the third width W3 is less than 200 μm, a strength of the second lead frame 140 may be reduced in the cutting process and the second lead frame 140 may be separated from the body 120 due to warping or the like. The third width W3 of an embodiment may be smaller than the second width W2, but is not limited thereto.

The third stepped portion 146 may be disposed at an edge of the lower surface 140f of the second lead frame 140. The third stepped portion 146 of an embodiment may be disposed under the sixth to eighth side portions 140b to 140d. The third stepped portion 146 may be spaced at a predetermined interval apart from the fifth side portion 140a. The third stepped portion 146 may be spaced apart from the ninth and tenth edge portions 149a and 149b in the first direction X. The third stepped portion 146 extends from the ninth and tenth edge portions 149a and 149b but is not overlapped with each other. The third stepped portion 146 may include seventh and eighth edge portions 146a and 146b in regions corresponding to the fifth and sixth edge portions 148a and 148b. The seventh and eighth edge portions 146a and 146b may be spaced apart from and parallel to the fifth and sixth edge portions 148a and 148b at a predetermined interval. Since the fifth side portion 140a is exposed to the outside and an external force is concentrated by the cutting process, for stiffness, the fifth side portion 140a may be spaced apart from the third stepped portion 146. The third stepped portion 146 may be a recessed shape and a cross-section thereof may be a stepped structure, but is not limited thereto. The third stepped portion 146 may enlarge a contact area with the body 120 to improve a coupling force with the body 120. In addition, the third stepped portion 146 may improve moisture penetration from the outside by the stepped structure. The third stepped portion 146 may be formed by etching a part of an edge of a lower surface of the second lead frame 140, but is not limited thereto. A thickness of the third stepped portion 146 may be 50% of that of the second lead frame 140, but is not limited thereto. For example, the thickness of the third stepped portion 146 may be 50% or more of that of the second lead frame 140.

The second through hole 147 may penetrate from the upper surface 140e of the second lead frame 140 to the lower surface 140f. The second through hole 147 may be disposed adjacent to the fifth side portion 140a. The second through hole 147 may be disposed between the ninth and tenth edge portions 149a and 149b, but is not limited thereto. The second through hole 147 may include a fourth stepped portion 144. The fourth stepped portion 144 may have a thickness corresponding to the third stepped portion 146. A second diameter D2 of the second through hole 147 may be 50 μm or more. For example, the second diameter D2 may be 50 to 500 μm. When the second diameter D2 is less than 50 μm, not only a manufacturing may be difficult, but also a coupling with the body 120 may be deteriorated.

The first to fourth stepped portions 136, 134, 146, and 144 of an embodiment may include a width of 50 to 500 μm in the first direction X.

An embodiment proposes a structure in which a second interval I2 of the third and seventh side portions 130c and 140c and the fourth and eighth side portions 130d and 140d is wider by the first, second, fifth and sixth edge portions 138a, 138b, 148a, and 148b than a spaced first interval I1 of the second and sixth side portions 130b and 140b, which face each other, of the first and second lead frames 130 and 140, and thus injection molding of the spaced space between the first lead frame 130 and the second lead frame 140 may be improved. For example, the first interval I1 may be 50% or less of the second interval I2.

That is, in an embodiment, the first, second, fifth, and sixth edge portions 138a, 138b, 148a, and 148b may be disposed around the spaced space of the first and second lead frames 130 and 140 to improve injection molding defects, thereby improving productivity.

The light emitting device package 100 of an embodiment may include the seventh to tenth edge portions 139a, 139b, 149a, and 149b having the same thickness as that of the first and fifth side portions 130a and 140a around the first and fifth side portions 130a and 140a in which the first and second lead frames 130 and 140 are exposed, and thus stiffness of the first and second lead frames 130 and 140 may be improved. That is, the stiffness of the first and second lead frames 130 and 140 may be improved and the coupling force with the body 120 may be improved by the structure of the first and third stepped portions 136 and 146 disposed at the edges of the lower surfaces 130f and 140f of the first and second lead frames 130 and 140, and the seventh to tenth edge portions 139a, 139b, 149a, and 149b.

In addition, an embodiment proposes a structure in which the second interval I2 of the third and seventh side portions 130c and 140c and the fourth and eighth side portions 130d and 140d is wider by the first, second, fifth and sixth edge portions 138a, 138b, 148a, and 148b than the spaced first interval I1 of the second and sixth side portions 130b and 140b, which face each other, of the first and second lead frames 130 and 140, and thus injection molding of the spaced space between the first lead frame 130 and the second lead frame 140 may be improved.

That is, in an embodiment, the first, second, fifth, and sixth edge portions 138a, 138b, 148a, and 148b may be disposed around the spaced space of the first and second lead frames 130 and 140 to improve injection molding defects, thereby improving productivity.

In an embodiment, the first to fourth stepped portions 136, 134, 146, and 144 having a cross-section of a rectangular structure are limited to be described, but is not limited thereto.

FIG. 7 is a cross-sectional view illustrating a light emitting device package according to another embodiment.

As shown in FIG. 7, the light emitting device package according to another embodiment may include first to fourth stepped portions 236, 234, 246, and 244 having a cross-section of a curved structure.

The first to fourth stepped portions 236, 234, 246 and 244 may employ technical features of FIGS. 1 to 6 except for a cross-section of a curved structure.

FIG. 8 is a plan view illustrating first and second lead frames according to another embodiment.

As shown in FIG. 8, the light emitting device package according to another embodiment may employ the technical features of the light emitting device package 100 according to an embodiment of FIGS. 1 to 6 except first and second curved surface portions 238a and 238b of a first lead frame 230 and third and fourth curved surface portions 248a and 248b of a second lead frame 240.

The first and second curved surface portions 238a and 238b may be disposed at both ends of the second side portion 130b. The first and second curved surface portions 238a and 238b may be symmetrical in the second direction Y. The first and second curved surface portions 238a and 238b may improve reliability of forming the body 120 in the process of coupling the body 120 and the first and second lead frames 230 and 240. For example, the body 120, the first and second lead frames 230 and 240 may be coupled by an injection process. The first and second curved surface portions 238a and 238b may improve an injection flow into a spaced space of the first and second lead frames 230 and 240 in the injection process of the body 120. The first and second curved surface portions 238a and 238b may have a predetermined curvature. The first and second curved surface portions 238a and 238b may have the same curvature, but is not limited thereto.

The third and fourth curved surface portions 248a and 248b may be disposed at both ends of the sixth side portion 140b. The third and fourth curved surface portions 248a and 248b may be symmetrical in the second direction Y. The third and fourth curved surface portions 248a and 248b may improve reliability of forming the body 120 in the process of coupling the body 120 and the first and second lead frames 230 and 240. For example, the body 120, the first and second lead frames 230 and 240 may be coupled by the injection process. The third and fourth curved surface portions 248a and 248b may improve the injection flow into the spaced space of the first and second lead frames 230 and 240 in the injection process of the body 120. The third and fourth curved surface portions 248a and 248b may have a predetermined curvature. The third and fourth curved surface portions 248a and 248b may have the same curvature, but is not limited thereto. The third curved surface portion 248a may be opposite to the first curved surface portion 238a. The third curved surface portion 248a may face the first curved surface portion 238a. The fourth curved surface portion 248b may be opposite to the second curved surface portion 238b. The fourth curved surface portion 248b may face the second curved surface portion 238b.

Another embodiment proposes a structure in which the second interval I2 of the third and seventh side portions 130c and 140c and the fourth and eighth side portions 130d and 140d is wider by the first to fourth curved surface portions 238a, 238b, 248a, and 248b than the spaced first interval I1 of the second and sixth side portions 130b and 140b, which face each other, of the first and second lead frames 230 and 240, and thus injection molding of the spaced space between the first lead frame 230 and the second lead frame 240 may be improved.

That is, in an embodiment, the first to fourth curved surface portions 238a, 238b, 248a, and 248b may be disposed around the spaced space of the first and second lead frames 230 and 240 to improve injection molding defects, thereby improving productivity.

FIG. 9 is a view illustrating an area A of FIG. 2 according to still another embodiment.

As shown in FIG. 9, still another embodiment provides a light emitting device package capable of improving reliability of injection molding of the body 120 and improving light extraction efficiency.

The body 120 of still another embodiment may include at least one of a light-transmitting material, a reflective material, and an insulating material. The body 120 may include a material having higher reflectance than transmittance for light emitted from the light emitting device 150. The body 120 may be a resin-based insulating material. For example, the body 120 may be formed of at least one of a resin material such as polyphthalamide (PPA), epoxy or silicone material, silicon (Si), a metal material, photo sensitive glass (PSG), sapphire ($Al_2O_3$), and a printed circuit board (PCB). The body 120 may include an outer side surface having a predetermined curvature or an outer side surface having an angular surface. The body 120, for example, may have a top view in a circular or polygonal shape. The body 120 of an embodiment will be described as an example of taking a polygonal shape including the first to fourth outer side surfaces 121 to 124.

The body 120 may be coupled to the first and second lead frames 130 and 140. The body 120 may include a cavity 125 in which a part of upper surfaces of the first and second lead frames 130 and 140 is exposed.

The cavity 125 may include first to fourth inner side surfaces 126a to 126d, and may include a first bottom surface 125a configured to expose the first lead frame 130 and second and third bottom surfaces 125b and 125c configured to expose the second lead frame 140. Here, the first bottom surface 125a may correspond to the first lead frame 130 exposed by the first to fourth inner side surfaces 126a to 126d. The second and third bottom surfaces 125b and 125c may correspond to the second lead frame 140 exposed from the second inner side surface 126b.

The first inner side surface 126a may face the second inner side surface 126b in the first direction X. The first and second inner side surfaces 126a and 126b may be inclined from the first bottom surface 125a and disposed symmetrical to each other. The third inner side surface 126c may face the fourth inner side surface 126d in the second direction Y. The third and fourth inner side surfaces 126c and 126d may be inclined from the first bottom surface 125a and disposed symmetrical to each other. The first inner side surface 126a of the cavity 125 may face a first side surface 150a of the light emitting device 150. The second inner side surface 126b of the cavity 125 may face a second side surface 150b of the light emitting device 150. The third inner side surface 126c of the cavity 125 may face a third side surface 150c of the light emitting device 150. The fourth inner side surface 126d of the cavity 125 may face a fourth side surface 150d of the light emitting device 150. The first to fourth inner side surfaces 126a to 126d of the cavity 125 may be disposed at a predetermined interval from the first to fourth side surfaces 150a to 150d of the light emitting device 150.

The cavity 125 may include a first corner 127a between the first and third inner side surfaces 126a and 126c, a second corner 127b between the first and fourth inner side surfaces 126a and 126d, a third corner 127c between the second and fourth inner side surfaces 126b and 126d, and a fourth corner 127d between the second and third inner side surfaces 126b and 126c.

The first corner 127a may include a first curvature R1 having a predetermined interval from the light emitting device 150. The first curvature R1 may be 50 µm or more. In an embodiment, an injection flow around the first corner 127a may be improved in the injection process by the first corner 127a having the first curvature R1 of 50 µm or more, thereby improving crack defects.

The second corner 127b may include a second curvature R2 having a predetermined interval from the light emitting device 150. The second curvature R2 may be 50 µm or more. The first and second curvatures R1 and R2 may be the same curvature, but is not limited thereto. In an embodiment, an injection flow around the second corner 127b may be improved in the injection process by the second corner 127b having the second curvature R2 of 50 µm or more, thereby improving crack defects.

The third corner 127c may include a third curvature R3. The third curvature R3 may be 50 µm or more, but is not limited thereto. For example, the third curvature R3 may be the same as the first curvature R1 and the second curvature R2, but is not limited thereto. In an embodiment, an injection flow around the third corner 127c may be improved in the injection process by the third corner 127c having the third curvature R3 of 50 µm or more, thereby improving crack defects.

The fourth corner 127d may include a fourth curvature R4. The fourth curvature R4 may be 50 µm or more, but is not limited thereto. The fourth curvature R4 may be the same as the first curvature R1 and the second curvature R2, but is not limited thereto. The third and fourth curvatures R3 and R4 may be the same curvature, but are not limited thereto. In an embodiment, an injection flow around the fourth corner 127d may be improved in the injection process by the fourth corner 127d having the fourth curvature R4 of 50 µm or more, thereby improving crack defects.

The cavity 125 may include a first wire recess portion 127e extended from the third corner 127c and a second wire recess portion 127f extended from the fourth corner 127d.

The first wire recess portion 127e may be disposed in the direction from the third corner 127c to the second inner side surface 126b of the cavity 125. The first wire recess portion 127e may expose the second lead frame 140 connected to a first wire 150 W of the light emitting device 150. The first wire recess portion 127e may include a fifth curvature R5. The fifth curvature R5 may be 50 µm or more. The fifth curvature R5 may be smaller than the first to fourth curvatures R1 to R4, but is not limited thereto. In an embodiment, an injection flow around the first wire recess portion 127e may be improved in the injection process by the first wire recess portion 127e having the fifth curvature R5 of 50 µm or more, thereby improving crack defects.

The second wire recess portion 127f may be disposed in the direction from the fourth corner 127d to the third inner side surface 126c of the cavity 125. The second wire recess portion 127f may expose the first lead frame 130 connected to a second wire 160 W of the protective device 160. The second wire recess portion 127f may include a sixth curvature R6. The sixth curvature R6 may be 50 µm or more. The fifth and sixth curvatures R5 and R6 may be the same curvature, but is not limited thereto. The fifth curvature R5 may be smaller than the first to fourth curvatures R1 to R4, but is not limited thereto. In an embodiment, an injection flow around the second wire recess portion 127f may be improved in the injection process by the second wire recess portion 127f having the sixth curvature R6 of 50 µm or more, thereby improving crack defects.

The body 120 may include first to fourth outer side surfaces 121 to 124, and may have a top view in a rectangular shape. The first and second outer side surfaces 121 and 122 may be disposed in parallel in a first direction X. In an embodiment, a part of the first and second lead frames 130 and 140 may be exposed from the first and second outer side surfaces 121 and 122. In an embodiment, a first protrusion part 131 of the first lead frame 130 may be exposed from the first outer side surface 121. In an embodiment, a second protrusion part 141 of the second lead frame 140 may be exposed from the second outer side surface 122. The first and second protrusion parts 131 and 141 may be disposed in parallel in a second direction Y orthogonal to the first direction X.

The light emitting device package of still another embodiment may improve defects such as cracks that may occur in the edge region of the cavity 125 by the first to fourth corners 127a to 127d having the first to fourth curvatures R1 to R4 of the cavity 125 configure to expose the first and second lead frames 130 and 140. That is, an embodiment may improve reliability of the injection molding for coupling the body 120 and the first and second lead frames 130 and 140.

In addition, in still another embodiment, the first wire recess portion 127e in which the first wire 150 W of the light emitting device 150 is disposed and the second wire recess portion 127f in which the second wire 160 W of the protective device 160 is disposed may include predetermined fifth and sixth curvatures R5 and R6 respectively, and thus, defects such as cracks may be improved in the injection process of the body 120.

In addition, in still another embodiment, an interval between inner side surfaces of the cavity 125 and the light emitting device 150 is uniformly maintained as a whole, and thus light loss may be improved in a corner region of the cavity 125. That is, in an embodiment, light extraction efficiency may be improved.

<Light Emitting Chip>

FIG. 10 is a sectional view illustrating a light emitting chip provided in a light emitting package of an embodiment.

As illustrated in FIG. 10, the light emitting chip includes a substrate 511, a buffer layer 512, a light emitting structure 510, a first electrode 516, and a second electrode 517. The substrate 511 may be a translucent or non-translucent material, and may include a conductive or insulating substrate.

The buffer layer 512 reduces a difference between the lattice constants of the materials of the substrate 511 and the light emitting structure 510, and may be formed of a nitride semiconductor. A nitride semiconductor layer that is not doped by a dopant may be further formed between the buffer layer 512 and the light emitting structure 510 to improve the quality of crystals.

The light emitting structure 510 includes a first conductive semiconductor layer 513, an active layer 514, and a second conductive type semiconductor layer 515.

For example, the light emitting structure may be implemented by composite semiconductors such as group II-group IV and group III-group V. The first conductive type semiconductor layer 513 may be mono-layered or multi-layered. The first conductive type semiconductor layer 513 may be doped by a first conductive dopant. For example, when the first conductive type semiconductor layer 513 is an n type semiconductor layer, it may include an n type dopant. For example, the n type dopant may include Si, Ge, Sn, Se, and Te, but the present disclosure is not limited thereto. The first conductive semiconductor layer 513 may include an empirical formula of $In_xAl_yGa_{1-x-y}N$ ($0 \leq x \leq 1$, $0 \leq y \leq 1$, $0 \leq x+y \leq 1$). The first conductive semiconductor layer 513, for example, may include a stack structure of layers that include at least one of GaN, InN, AlN, InGaN, AlGaN, InAlGaN, AlInN, AlGaAs, GaP, GaAs, GaAsP, and AlGaInP.

A first clad layer may be formed between the first conductive semiconductor layer 513 and the active layer 514. The first clad layer may be formed of a GaN based semiconductor, and a band gap of the first clad layer may be not less than a band gap of the active layer 514. The first clad layer may be formed of a first conductive type, and may include a function of constraining carriers.

The active layer 514 is arranged on the first conductive type semiconductor layer 513, and selectively includes a single quantum well structure, a multiple quantum well (MQW) structure, a quantum wire structure, and a quantum dot structure. The active layer 514 includes a period of well layers and barrier layers. The well layer includes an empirical formula of $In_xAl_yGa_{1-x-y}N$ ($0 \leq x \leq 1$, $0 \leq y \leq 1$, $0 \leq x+y \leq 1$), and the barrier layer may include an empirical formula of $In_xAl_yGa_{1-x-y}N$ ($0 \leq x \leq 1$, $0 \leq y \leq 1$, $0 \leq x+y \leq 1$). One or more periods of well layers and barrier layers, for example, may be formed by using a stack structure of InGaN/GaN, GaN/AlGaN, InGaN/AlGaN, InGaN/InGaN, or InAlGaN/InAlGaN. The barrier layer may be formed of a semiconductor material having a band gap that is larger than a band gap of the well layer.

The second conductive semiconductor layer 515 is formed on the active layer 514. The second conductive semiconductor layer 515 may be implemented by a semiconductor composite, for example, a group II-group IV and group III-group V composite semiconductor. The second conductive type semiconductor layer 515 may be mono-layered or multi-layered. When the second conductive semiconductor layer 515 is a p type semiconductor layer, the second conductive dopant is a p type dopant and may include Mg, Zn, Ca, Sr, and Ba. The second conductive type semiconductor layer 515 may be doped by a second conductive dopant. The first conductive semiconductor layer 515 may include an empirical formula of $In_xAl_yGa_{1-x-y}N$ ($0 \leq x \leq 2$, $0 \leq y \leq 1$, $0 \leq x+y \leq 1$). The second conductive semiconductor layer 515 may include any one of GaN, InN, AlN, InGaN, AlGaN, InAlGaN, AlInN, AlGaAs, GaP, GaAs, GaAsP, and AlGaInP.

The second conductive semiconductor layer 515 may include an ultra-lattice structure, and the ultra-lattice structure may include an InGaN/GaN ultra-lattice structure or an AlGaN/GaN ultra-lattice structure. The ultra-lattice structure of the second conductive semiconductor layer 515 abnormally diffuses currents included in a voltage, and may protect the active layer 514.

It has been described that the first conductive semiconductor layer 513 is a n type semiconductor layer and the second conductive semiconductor layer 515 is a p type semiconductor layer, but the first conductive type semiconductor layer 513 may be a p type semiconductor layer and the second conductive semiconductor layer 515 is a n type semiconductor layer and the present disclosure is not limited thereto. A semiconductor having a polarity that is opposite to that of the second conductive type, for example, an n type semiconductor layer (not illustrated) may be formed on the second conductive semiconductor layer 515. Accordingly, the light emitting structure 510 may be implemented by any one of an n-p junction structure, a p-n junction structure, an n-p-n junction structure, and a p-n-p junction structure.

The first electrode 516 is arranged on the first conductive semiconductor layer 513, and the second electrode 517 having a current diffusion layer is proved on the second conductive semiconductor layer 515.

<Light Emitting Chip>

FIG. 11 is a sectional view illustrating another example of a light emitting chip provided in a light emitting package of the embodiment.

As illustrated in FIG. 11, a description of the same configuration of the light emitting chip of FIG. 9 will be omitted in the second example. In the light emitting chip of the second example, a contact layer 521 may be arranged under the light emitting structure 510, a reflective layer 524 may be arranged under the contact layer 521, a support member 525 may be arranged under the reflective layer 524, and a protective layer 523 may be arranged around the reflective layer 524 and the light emitting structure 510.

In the light emitting chip, the contact layer 521 and the protective layer 523, the reflective layer 524, and the support member 525 may be arranged under the second conductive semiconductor layer 515.

The contact layer 521 may make ohmic contact with a lower surface of the light emitting structure 510, for example, the second conductive semiconductor layer 515. The contact layer 521 may be formed of a material selected from a metal nitride, an insulating material, and a conductive material, and for example, may be formed of a material including, for example, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au, Hf, a selective combination thereof. Further, the contact layer 521 may be multilayered by using the metal material and a translucent conductive material such as IZO, IZTO, IAZO, IGZO, IGTO, AZO, or ATO, and for example, may have a stack structure of IZO/Ni, AZO/Ag, IZO/Ag/Ni, and AZO/Ag/Ni. A current blocking layer that blocks a current to correspond to the electrode 516 may be further formed in the interior of the contact layer 521.

The protective layer 523 may be formed of a material selected from a metal oxide, an insulating material, and a conductive material, and for example, may be formed of a material including, for example, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $SiO_x$, $SiO_xN_y$, $Si_3N_4$, $Al_2O_3$, and $TiO_2$. The protective layer 523 may be formed by using sputtering or deposition, and may prevent a metal such as the reflective layer 524 from short-circuiting layers of the light emitting structure 510.

The reflective layer 524 may include a metal. For example, the reflective layer 524 may be formed of Ag, Ni, Al, Rh, Pd, Ir, Ru, Mg, Zn, Pt, Au, Hf, or a selective combination thereof. The reflective layer 524 may have a width that is larger than the width of the light emitting structure 510 to improve light reflection efficiency. A metal layer for junction, a metal layer for diffusing heat, and the like may be further arranged between the reflective layer 524 and the support member 525, but the present disclosure is not limited thereto.

The support member 525 is a base substrate, and may be implemented by a metal such as copper (Cu), gold (Au), nickel (Ni), molybdenum (Mo), or copper-tungsten (Cu—W) or a carrier wafer (for example, Si, Ge, GaAs, ZnO, or SiC). A junction layer may be further formed between the support member 525 and the reflective layer 524.

<Lighting System>

FIG. 12 is a perspective view illustrating a display device that includes the light emitting package of the embodiment.

As illustrated in FIG. 12, the display device 1000 of the embodiment may include a light guide plate 1041, a light source module 1031 that provides light to the light guide plate 1041, a reflective member 1022 under the light guide plater 1041, an optical sheet 1051 on the light guide plate, a display panel 1061 on the optical sheet 1051, and a bottom cover 1011 that receives the light guide plate 1041, the light source module 1031, and the reflective member 1022.

The bottom cover 1011, the reflective sheet 1022, the light guide plate 1041, and the optical sheet 1051 may be defined by a light unit 1050.

The light guide plate 1041 functions to diffuse light to provide a surface light source. The light guide plate 1041 is formed of a transparent material, and for example, may include any one of an acryl resin such as polymethyl metaacrylate (PMMA), and resins including polyethylene terephthalate (PET), poly carbonate (PC), cycloolefin copolymer (COC), and polyethylene naphthalate (PEN).

The light source module 1031 provides light to at least one surface of the light guide plate 1041, and ultimately is applied as a light source of the display device.

At least one light source module 1031 is provided to directly or indirectly provide light from one side surface of the light guide plate 1041. The light source module 1031 may include the light emitting package 100 according to the embodiment, and a plurality of light emitting packages 100 may be arranged ono the board 1033 to be spaced apart from each other at a gap.

The board 1033 may be a printed circuit board (PCB) that includes a circuit pattern (not illustrated). However, the board 1033 may include a metal core PCB (MCPCB) and a flexible PCB (FPCB), as well as a general PCB, but the present disclosure is not limited thereto. The light emitting package 100 may be directly arranged on a side surface of the bottom cover 1011 or a heat dissipating plate.

The reflective member 1022 may be disposed under the light guide plate 1041. The reflective member 1022 may reflect light input to a lower surface of the light guide plate 1041 to improve the luminance of the light unit 1050. The reflective member 1022, for example, may be formed of PET, PC, or PVC, but the present disclosure is not limited thereto.

The bottom cover 1011 may receive the light guide plate 1041, the light source module 1031, and the reflective member 1022. The bottom cover 1011 may include a receiving part 1012 having an open-topped box shape, but the present disclosure is not limited thereto. The bottom cover 1011 may be coupled to a top cover, but the present disclosure is not limited thereto.

The bottom cover 1011 may be formed of a metal or a resin, and may be manufactured by using a process such as pressing or extrusion. Further, the bottom cover 1011 may include a conductive metal or a non-metal.

The display panel 1061, for example, is an LCD panel, and may include first and second transparent substrates that is opposite to each other, and a liquid crystal layer that is interposed between the first and second substrates. A polarized plate may be arranged on at least one surface of the display panel 1061. The display panel 1061 displays information through the light that passed through the optical sheet 1051. The display device 1000 may be applied to various portable terminals, a monitor of a notebook computer, a monitor of a laptop computer, or a television.

The optical sheet 1051 may be arranged between the display panel 1061 and the light guide plate 1041. The optical sheet 1051 may include at least one translucent sheet. The optical sheet 1051, for example, may include at least one of a diffusion sheet, at least one prism sheet, and a protective sheet. The diffusion sheet may include a function of diffusing input light. The prism sheet may include a function of condensing input light to a display area. The protective sheet may include a function of protecting the prism sheet.

<Lighting Device>

FIG. 13 is a sectional view illustrating another example of the display device that includes the light emitting package of the embodiment.

As illustrated in FIG. 13, the display device 1100 of the second example may include a bottom cover 1152, a board 1120 on which a light emitting package 100 is mounted, an optical member 1154, and a display panel 1155.

The board 1120 and the light emitting package 100 may be defined as a light source module 1160. The bottom cover 1152, the at least one light source module 1160, and the optical member 1154 may be defined as a light unit 1150. The bottom cover 1152 may be coupled to a top cover, but the present disclosure is not limited thereto. The light source module 1160 may include a board 1120, and a plurality of light emitting packages 100 that is arranged on the board 1120.

Here, the optical member 1154 may include at least one of a lens, a diffusion plate, a diffusion sheet, a prism sheet, and a protective sheet. The diffusion plate may be formed of PC or poly methyl methacrylate (PMMA). The diffusion sheet may diffuse input light, the prism sheet may condense the input light to a display area, and the protective sheet may protect the prism sheet.

The optical member 1154 is arranged on the light source module 1060 to use the light emitted from the light source module 1160 as a surface light source, and diffuses and condenses the light.

The above-described light emitting device is composed of a light emitting device package and may be used as a light source of a lighting system, for example, may be used as a light source of an image display device or a lighting device.

When the light emitting device is used as a backlight unit of an image display device, it may be used as an edge-type backlight unit or a direct-type backlight unit. When the light emitting device is used as a light source of a lighting device, it may be used as a lamp or bulb type, and may be used as a light source of a mobile terminal.

The light emitting device includes a laser diode in addition to the light emitting diode described above.

The laser diode may include a first conductive semiconductor layer, an active layer, and a second conductive semiconductor layer having the above-described structure, similarly to the light emitting device. After bonding a p-type first conductive semiconductor and an n-type second conductive semiconductor, it is possible to utilize an electroluminescence phenomenon in which light is emitted when a current is flowed, but there is a difference in a direction and phase of the emitted light. That is, the laser diode may emit light having the same phase in the same direction with one specific wavelength (monochromatic beam) by using a phenomenon called stimulated emission and a reinforcing interference phenomenon and may be used for optical communication, medical equipment, semiconductor process equipment, and the like due to such characteristics.

As an example of a light-receiving device, there is a photodetector which is a kind of transducer, detects light and converts the intensity of the light into an electric signal. As such a photodetector, there is a photocell (e.g., silicon or selenium), a photoconductive device (e.g., cadmium sulfide or cadmium selenide), a photodiode (e.g., a visible blind spectral region or a PD having a peak wavelength in a true blind spectral region), a phototransistor, an optoelectronic amplifying tube, a phototube (e.g., vacuum or filled with gas), an infrared (IR) detector, or the like, but an embodiment is not limited thereto.

In addition, a semiconductor device such as a photodetector may be generally fabricated by using a direct bandgap semiconductor having excellent light conversion efficiency.

Alternatively, the photodetector has a variety of structures, and the most general structure includes a pin-type photodetector using a p-n junction, a Schottky-type photodetector using a Schottky junction, and a metal-semiconductor-metal (MSM)-type photodetector and the like.

A photodiode may include a first conductive semiconductor layer, an active layer, and a second conductive semiconductor layer having the above-described structure, similarly to the light emitting device, and may be formed in a p-n junction or a pin structure. The photodiode operates by applying a reverse bias or a zero bias. When light is incident on the photodiode, electrons and holes are generated and a current flows. At this point, a magnitude of the current may be approximately proportional to intensity of light incident on the photodiode.

A photovoltaic cell or a solar cell is a type of photodiode that may convert light into current. The solar cell may include a first conductive semiconductor layer, an active layer, and a second conductive semiconductor layer having the above-described structure, similarly to the light emitting device.

In addition, it may be used as a rectifier of an electronic circuit through a rectifying characteristic of a general diode using a p-n junction, and may be applied to an oscillation circuit or the like by being applied to a microwave circuit.

In addition, the above-described semiconductor device is not necessarily implemented as a semiconductor, and may further include a metal material in some cases. For example, a semiconductor device such as a light-receiving device may be implemented using at least one of Ag, Al, Au, In, Ga, N, Zn, Se, P, and As, or may be implemented using a semiconductor material doped with a p-type or n-type dopant or an intrinsic semiconductor material. The above description of the present invention is merely an example. It would be apparent to those of ordinary skill in the art that the present invention may be easily embodied in many different forms without changing the technical idea or essential features thereof. For example, devices of the exemplary embodiments described herein may be modified and realized. Also, it should be construed that differences related to such variations and applications are included in the scope of the present invention defined in the appended claims.

The invention claimed is:

1. A light emitting device package, comprising:
a first lead frame;
a light emitting device disposed on the first lead frame;
a second lead frame spaced apart from the first lead frame in a first direction;
a protective device disposed on the second lead frame; and
a body coupled to the first and second lead frames,
wherein the body including a cavity exposing a portion of an upper surface of the first lead frame and an upper surface of the second lead frame,
wherein the cavity includes first to fourth inner side surfaces which are inclined, respectively,
wherein the first inner side surface faces the second inner side surface in the first direction,
wherein the third inner side surface faces to the fourth inner side surface in a second direction,
wherein the first to fourth inner side surfaces face the first to fourth sides of the light emitting device, respectively,
wherein the cavity has a first bottom surface that exposes a part of an upper surface of the first lead frame; a second bottom surface on which a part of an upper surface of the second lead frame is exposed and on which the protection device is disposed; and a third bottom surface on which a part of the upper surface of the second lead frame is exposed and spaced apart from the second bottom surface,
wherein the first lead frame comprises a first stepped portion disposed along an edge of a lower surface thereof and at least one first through hole,
wherein the first through hole includes a second stepped portion disposed at an inner side thereof,
wherein the cavity includes a first recess portion exposing the second lead frame and a second recess portion exposing the first lead frame,
wherein the second lead frame comprises a third stepped portion disposed along an edge of a lower surface thereof, and a mounting region of the protective device which is not overlapped in a vertical direction and spaced apart from the third stepped portion, wherein a part of the second recess portion is overlapped with the third stepped portion in the vertical direction, wherein a minimum distance between the first recess portion and the second recess portion is greater than a length of one side of the light emitting device, and wherein the first recess portion is not overlapped with a second side of the light emitting device in the first direction.

2. The light emitting device package of claim 1, wherein the first and third stepped portions comprise a stepped structure in a cross-section thereof.

3. The light emitting device package of claim 1, wherein the first lead frame comprises first to fourth side portions along an outer side surface thereof, and the first stepped portion is disposed in an inward direction from the second to fourth side portions, wherein the second lead frame comprises fifth to eighth side portions along an outer side surface thereof, and the third stepped portion is disposed in the inward direction from the fifth to eighth side portions, wherein the second side portion of the first lead frame and the sixth side portion of the second lead frame face each other, and wherein a region between the second side portion of the first lead frame and the sixth side portion of the second lead frame overlap with a lower portion of the second inner side surface adjacent the light emitting device.

4. The light emitting device package of claim 3, wherein the first through hole is spaced at a predetermined interval apart from the edge of the first lead frame adjacent to the first side portion, wherein the first through hole is disposed at both corners of the first side portion disposed on the opposite side of the second side portion, respectively, and wherein a diameter of the first through hole at an upper surface of the first through hole is 50 to 500 μm.

5. The light emitting device package of claim 3, wherein the second lead frame comprises at least one second through hole, and the second through hole is disposed adjacent to the fifth side portion, wherein the second through hole comprises a fourth stepped portion disposed at an inner side, and a diameter of the second through hole at an upper surface of the second through hole is 50 to 500 μm.

6. The light emitting device package of claim 3, wherein the first lead frame comprises first and second edge portions which are symmetrical to each other at both end portions of the second side portion facing the second lead frame, wherein each of the first and second edge portions comprises a width of 50 to 500 μm.

7. The light emitting device package of claim 3, wherein the second lead frame comprises third and fourth edge portions which are symmetrical to each other at both end portions of the sixth side portion facing the second lead frame, wherein each of the third and fourth edge portions comprises a width of 50 to 500 μm.

8. The light emitting device package of claim 1, wherein each of the first and third stepped portions comprises a width of 50 to 500 μm in the first direction.

9. The light emitting device package of claim 1, wherein the first lead frame includes first to fourth side portions along an outer side surface thereof, wherein the second lead frame includes fifth to eighth side portions along the outer side surface thereof, wherein the first side portion of the first lead frame is protruded outwardly from the first side surface of the body, wherein the second side portion of the second lead frame is protruded outwardly from the second side surface of the body, wherein the second side portion of the first lead frame and the sixth side portion of the second lead frame are disposed facing each other, wherein the third side portion of the first lead frame is disposed at an end of the first side portion, wherein the fourth side portion of the first lead frame is disposed at an end of the second side portion, wherein a seventh side portion of the second lead frame is disposed at the fifth side portion, wherein an eighth side portion of the second lead frame is disposed at an end of the sixth side portion, and wherein a first interval between the first and sixth side portions is 50% or less than a second interval between a third side portion of the first lead frame and the seventh side portion of the second lead frame.

10. The light emitting device package of claim 1, wherein the cavity includes a first corner between the first and third inner side surfaces and a second corner between the first and fourth inner side surfaces, wherein the first and second corners are spaced apart from the light emitting device, wherein the first corner has a first curvature, and wherein the second corner has a second curvature.

11. The light emitting device package of claim 10, wherein the first and second curvatures are equal to each other.

12. The light emitting device package of claim 10, wherein the cavity includes a third corner between the second and fourth inner surfaces and a fourth corner between the second and third inner surfaces, wherein the third corner has a third curvature, wherein the fourth corner has a fourth curvature, wherein the first recess portion extends from the third corner in direction of the second inner side surface, and wherein the second recess portion extends from the fourth corner in direction of the third inner side surface.

13. The light emitting device package of claim 12, wherein the third and fourth curvatures are equal to the first and second curvatures.

14. The light emitting device package of claim 1, wherein the second lead frame is connected to the light emitting device by a first wire, wherein the first lead frame is connected to a second wire of the protection device, wherein a lower portion of the second inner surface faces the second side of the light emitting device and overlaps the first and second lead frames in the vertical direction, wherein the lower portion of the second inner surface is disposed between the protective device and a lower edge of the second inner surface, and wherein the lower portion of the second inner surface is disposed between the protective device and the first recess portion.

15. The light emitting device package of claim 14, wherein the first recess portion has a fifth curvature, and wherein the second wire recess portion has a sixth curvature.

16. The light emitting device package of claim 15, wherein radiuses of the fifth curvature and the sixth curvature are equal to each other and smaller than the radiuses of each of a first curvature and a second curvature, and wherein the first and second curvatures are curvatures of a first corner and a second corner of the cavity, respectively.

17. The light emitting device package of claim 1, wherein each of the first and second recess portions has a curvature with a radius of more than 50 μm.

18. The light emitting device package of claim 6, wherein an angle between the first edge portion and the second side portion is an obtuse angle, and an angle between the second edge portion and the third side portion is an obtuse angle.

19. The light emitting device package of claim 1, wherein the first to fourth inner surfaces of the cavity have a predetermined distance from first to fourth sides of the light emitting device, wherein a lower edge of the first inner surface of the cavity is adjacent to the first side of the light emitting device, wherein a lower edge of the third inner surface of the cavity is adjacent to the third side of the light emitting device, wherein a lower edge of the fourth inner surface of the cavity is adjacent to the fourth side of the light emitting device, and wherein an interval between the lower edge of the first inner surface of the cavity and the first side of the light emitting device is the same as an interval the lower edge of the third inner surface of the cavity and the third side of the light emitting device.

20. The light emitting device package of claim 19, wherein the first recess portion and the second recess portion have the same radius of curvature.

\* \* \* \* \*